US012756153B2

(12) United States Patent
Hashimoto et al.

(10) Patent No.: US 12,756,153 B2
(45) Date of Patent: Oct. 6, 2026

(54) LIGHT EMITTING DEVICE

(71) Applicant: NICHIA CORPORATION, Anan (JP)

(72) Inventors: Takuya Hashimoto, Tokushima (JP); Soichiro Miura, Tokushima (JP)

(73) Assignee: NICHIA CORPORATION, Anan (JP)

( * ) Notice: Subject to any disclaimer, the term of this patent is extended or adjusted under 35 U.S.C. 154(b) by 508 days.

(21) Appl. No.: 18/506,391

(22) Filed: Nov. 10, 2023

(65) Prior Publication Data

US 2024/0113499 A1 Apr. 4, 2024

Related U.S. Application Data

(63) Continuation of application No. 17/845,464, filed on Jun. 21, 2022, now Pat. No. 11,855,409, which is a (Continued)

(30) Foreign Application Priority Data

Dec. 14, 2018 (JP) ................................ 2018-234017

(51) Int. Cl.
*H01S 5/02257* (2021.01)
*H01S 5/02208* (2021.01)
(Continued)

(52) U.S. Cl.
CPC ...... *H01S 5/02257* (2021.01); *H01S 5/02208* (2013.01); *H01S 5/02255* (2021.01); (Continued)

(58) Field of Classification Search
CPC ............... H01S 5/02212; H01S 5/0225–02257
See application file for complete search history.

(56) References Cited

U.S. PATENT DOCUMENTS 7,352,782 B2 * 4/2008 Kuwata ............... H01S 5/18394 372/9
8,855,155 B2 10/2014 Lutgen et al.
(Continued)

FOREIGN PATENT DOCUMENTS

CN 108288819 A 7/2018
EP 2452774 A1 5/2012
(Continued)

OTHER PUBLICATIONS

Non Final Office Action in the related U.S. Appl. No. 16/703,389, dated Oct. 21, 2021.
(Continued)

*Primary Examiner* — Xinning(Tom) Niu
*Assistant Examiner* — Delma R Forde
(74) *Attorney, Agent, or Firm* — Spencer Fane LLP

(57) ABSTRACT

A light emitting device includes a package, a cap, a joining member and at least one laser element. The package includes a metal film. The cap includes a light-transmissive member having a lower surface facing the package and an upper surface opposite to the lower surface, and a light blocking film arranged on the lower surface of the light-transmissive member and having a shape defining at least one opening. The joining member joins a part of the light blocking film and the metal film. The at least one laser element is positioned in a space bounded by the cap and the package such that a part of an edge of the at least one opening defined by the light blocking film is disposed directly above the at least one laser element.

19 Claims, 7 Drawing Sheets

Related U.S. Application Data continuation of application No. 16/703,389, filed on Dec. 4, 2019, now Pat. No. 11,394,170.

(51) Int. Cl.

| | |
|---|---|
| ***H01S 5/02255*** | (2021.01) |
| ***H01S 5/40*** | (2006.01) |
| *H01S 5/02325* | (2021.01) |
| *H01S 5/30* | (2006.01) |

(52) U.S. Cl.

CPC ........ *H01S 5/4093* (2013.01); *H01S 5/02325* (2021.01); *H01S 5/3013* (2013.01)

(56) References Cited

U.S. PATENT DOCUMENTS

| | | | | |
|---|---|---|---|---|
| 10,415,794 | B2 * | 9/2019 | Kiyota | F21V 9/30 |
| 2007/0056941 | A1 | 3/2007 | Murase et al. | |
| 2009/0068598 | A1 | 3/2009 | Murase et al. | |
| 2011/0109713 | A1 | 5/2011 | Yamaguchi et al. | |
| 2012/0039072 | A1 | 2/2012 | Lell et al. | |
| 2014/0204461 | A1 | 7/2014 | Imai et al. | |
| 2018/0058645 | A1 | 3/2018 | Kiyota et al. | |
| 2018/0301439 | A1 | 10/2018 | Peterson et al. | |

FOREIGN PATENT DOCUMENTS

| | | | |
|---|---|---|---|
| JP | H05-175474 | A | 7/1993 |
| JP | H08-213495 | A | 8/1996 |
| JP | H10-99978 | A | 4/1998 |
| JP | H11-300490 | A | 11/1999 |
| JP | H11-354889 | A | 12/1999 |
| JP | 2000-052070 | A | 2/2000 |
| JP | 2001-199747 | A | 7/2001 |
| JP | 2002-118188 | A | 4/2002 |
| JP | 2006-128514 | A | 5/2006 |
| JP | 2006-184758 | A | 7/2006 |
| JP | 2007-027471 | A | 2/2007 |
| JP | 2007-069257 | A | 3/2007 |
| JP | 2008-047701 | A | 2/2008 |
| JP | 2009-006350 | A | 1/2009 |
| JP | 2011-016135 | A | 1/2011 |
| JP | 2011-124541 | A | 6/2011 |
| JP | 2011-138953 | A | 7/2011 |
| JP | 2014-082452 | A | 5/2014 |
| JP | 2014-142387 | A | 8/2014 |
| JP | 2014-142729 | A | 8/2014 |
| JP | 2014-192647 | A | 10/2014 |
| JP | 2018037472 | A | 3/2018 |
| JP | 2018-133380 | A | 8/2018 |

OTHER PUBLICATIONS

Non Final Office Action in the related U.S. Appl. No. 17/845,464, dated Apr. 21, 2023.

* cited by examiner

LIGHT EMITTING DEVICE

CROSS-REFERENCE TO RELATED APPLICATION

This application is a continuation application of U.S. patent application Ser. No. 17/845,464, filed on Jun. 21, 2022, which is a continuation application of Ser. No. 16/703,389, filed on Dec. 4, 2019, now U.S. Pat. No. 11,394,170. This application claims priority to Japanese Patent Application No. 2018-234017 filed on Dec. 14, 2018. The entire disclosures of U.S. patent application Ser. Nos. 17/845,464 and 16/703,389, and Japanese Patent Application No. 2018-234017 are hereby incorporated herein by reference.

BACKGROUND

The present disclosure relates to a light emitting device and a method for manufacturing a light emitting device.

Japanese Patent Application Laid-open Publication No. 2011-124541 is an example of a light emitting element package. Japanese Patent Application Laid-open Publication No. 2011-124541 describes an optical device that has a package member, a cover glass that is joined to the package member, and a laser chip that is disposed in a space region bounded by the package member and the cover glass.

SUMMARY

The cover glass of the optical device described in Japanese Patent Application Laid-open Publication No. 2011-124541 is entirely light-transmissive. With a configuration such as this, there is the possibility that some of the light from the laser chip will be extracted from the cover glass as stray light. Also, with the optical device, it is not envisioned that information such as lot numbers will be printed, and no place is provided for printing such information.

The present disclosure includes the following aspects.

A light emitting device includes a package, a cap, a joining member and at least one laser element. The package includes a metal film. The cap includes a light-transmissive member having a lower surface facing the package and an upper surface opposite to the lower surface, and a light blocking film arranged on the lower surface of the light-transmissive member and having a shape defining at least one opening. The joining member joins a part of the light blocking film and the metal film. The at least one laser element is positioned in a space bounded by the cap and the package such that a part of an edge of the at least one opening defined by the light blocking film is disposed directly above the at least one laser element.

A light emitting device includes a package, a cap, a joining member, a submount, and at least one laser element. The package includes a metal film. The cap includes a light-transmissive member having a lower surface facing the package and an upper surface opposite to the lower surface, and a light blocking film arranged on the lower surface of the light-transmissive member and having a shape defining at least one opening. The joining member joins a part of the light blocking film and the metal film. The submount is positioned in a space bounded by the cap and the package such that a part of an edge of the at least one opening defined by the light blocking film is disposed directly above the submount. The at least one laser element is disposed on the submount.

Thus having the light blocking film serve both to reduce stray light and to ensure a mark formation region makes it possible to provide a light emitting device that can be made more compact and with which these effects can be obtained, as well as a method for manufacturing this device.

DETAILED DESCRIPTION

Figure 1A:
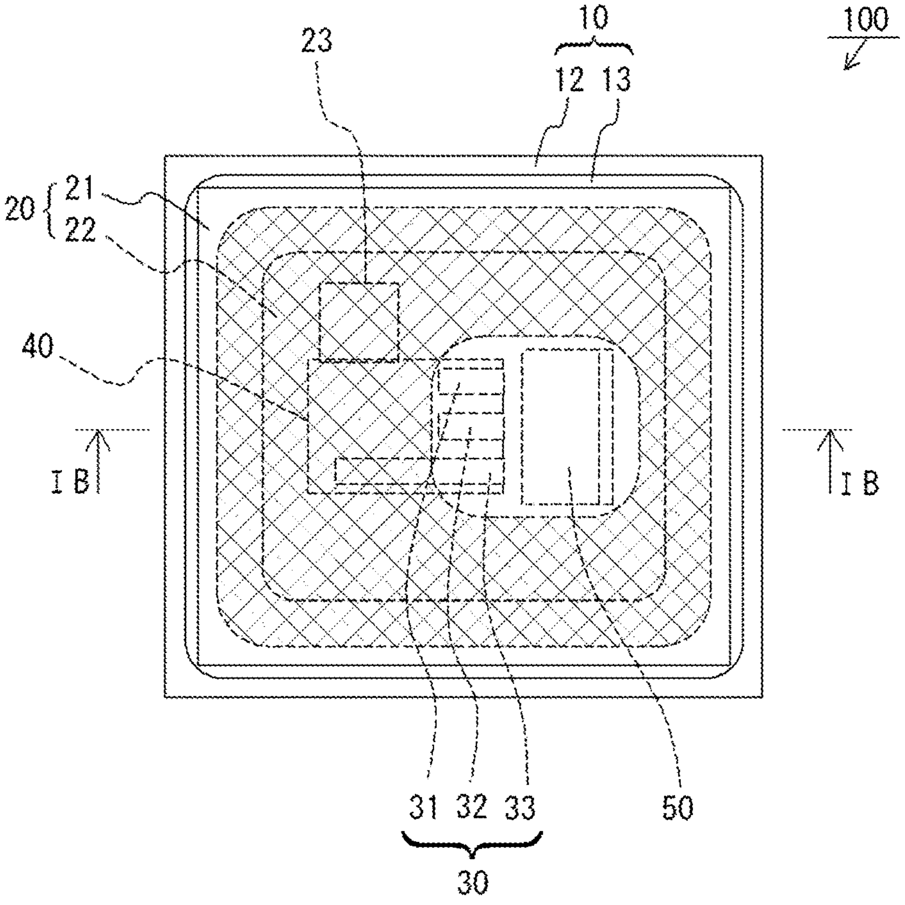
FIG. 1A is a plan view schematically showing the light emitting device according to an embodiment of the present disclosure.

The drawings referred to in the following description schematically show embodiments and, therefore, the scale, interval, positional relationship and the like of members may be exaggerated or partially omitted. Further, a plan view and a corresponding cross-sectional view may not coincide with each other in scale or interval of members. Further, in the following description, in principle, identical name and reference character denote an identical or similar member, and the detailed description thereof may be omitted as appropriate.

Figure 1B:
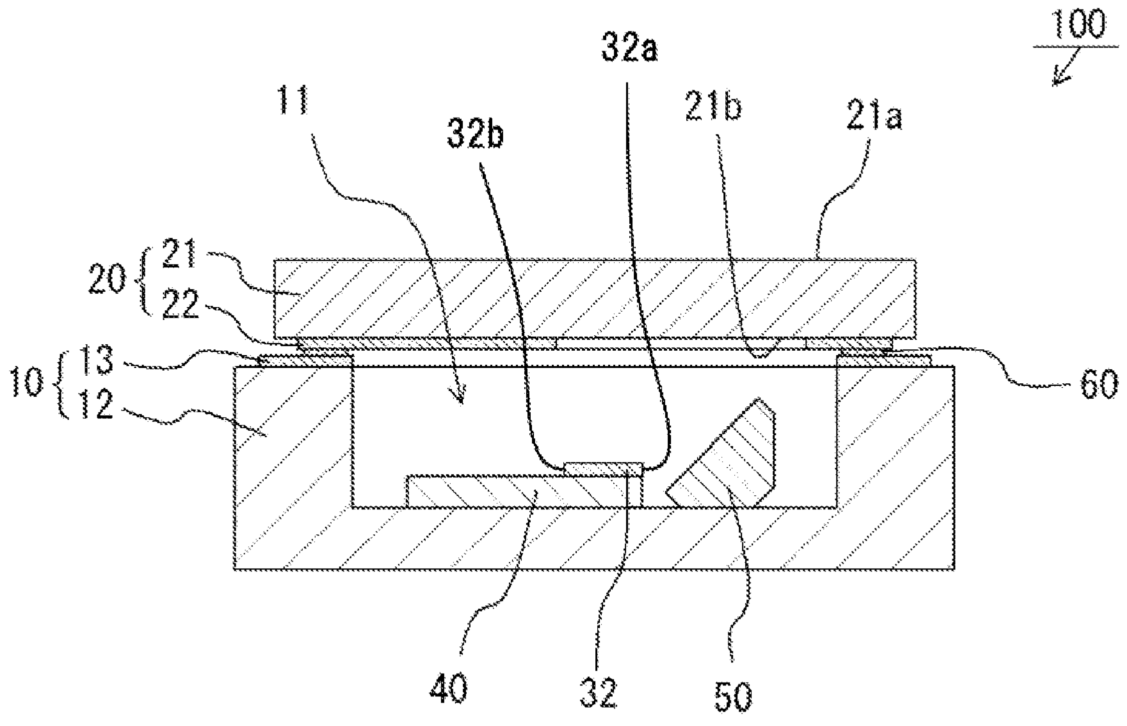
FIG. 1B is a cross-sectional view schematically showing the light emitting device taken along line IB-IB in FIG. 1A.

FIG. 1A is a plan view schematically showing the light emitting device according to an embodiment of the present disclosure, FIG. 1B is a cross-sectional view schematically showing the light emitting device taken along line IB-IB in FIG. 1A. The light emitting device 100 has a package 10, a cap 20, and laser elements 30 (31, 32, and 33). The package 10 defines a recess 11 that opens at the top. The cap 20 is fixed to the package 10 so as to cover the recess 11. The laser elements 30 are disposed in a space bounded by the cap 20 and the package 10. The laser elements 30 emit laser lights.

The cap 20 includes a light-transmissive member 21 having an upper surface 21*a* and a lower surface 21*b*, and a light blocking film 22 provided on the lower surface 21*b*. The cross-hatched area in FIG. 1A is the area where the light blocking film 22 is provided. The light blocking film 22 is provided so as to avoid the light extraction region, which is the portion of the lower surface 21*b* where the laser light is extracted to the outside. The light blocking film 22 is provided at a position overlapping at least a part of at least one of the laser elements 30 in top view. The light blocking film 22 is provided with a mark 23 that allows specific information to be read. In FIG. 1A, some of the components are indicated by broken lines, in a state of looking through the light-transmissive member 21 and the light blocking film 22. In this Specification, the surface of the light-transmissive member 21 that is irradiated with laser light is referred to as the bottom surface, and the surface on the opposite side is referred to as the upper surface. The same applies to the upper and bottom surfaces of other members and to the positional relationship between members.

The light blocking film 22 has the effect of reducing stray light by blocking light from the laser elements, and is used as the formation region of the mark 23. This makes it possible to obtain the light emitting device 100 which can be made more compact and with which the effects such as reducing stray light and to ensuring a mark formation region can be obtained. As shown in FIG. 1B, in the case where there is no light blocking film on the side surface of the light-transmissive member 21 and the side surface of the light-transmissive member 21 is exposed, if the light blocking film is provided to the upper surface 21*a* instead of the lower surface 21*b*, then there will be the possibility that the light reflected by the lower surface of the light blocking film may be extracted from the side surface of the light-transmissive member 21. For this reason, it is preferable to provide the light blocking film 22 on the lower surface 21*b*, because this will reduce stray light from the side surface of the light-transmissive member 21. Also, since a distance of an optical path of the emitted laser beam to the lower surface 21*b* is shorter than to the upper surface 21*a*, the size of the laser irradiating the lower surface 21*b* is smaller than that on the upper surface 21*a*. That is, the light extraction region that the light blocking film 22 is supposed to avoid will be smaller on the lower surface 21*b* than on the upper surface 21*a*. Therefore, providing the light blocking film 22 on the lower surface 21*b* allows the surface area of the light blocking film 22 to be increased as compared with the case where the light blocking film 22 is provided on the upper surface 21*a*. In order to form the mark 23, it is advantageous for the surface area of the light blocking film 22 to be large.

The light blocking film 22 is disposed at a position where the possibility of stray light being extracted from the light emitting device 100 can be reduced. The laser elements 30 have a light emitting end surface and a light reflecting end surface. In the example shown in FIG. 1B, the laser element 32 has a light emitting end surface 32*a* and a light reflecting end surface 32*b*. Stray light is, for example, light that leaks out from the light reflecting end surface of each of the laser elements. Therefore, it is preferable for the light blocking film 22 to be provided at a position where the light emitted (leaked) from the light reflection end surface reaches directly or after being reflected by the inner wall of the recess 11. The inner wall of the recess 11 includes a bottom surface and a side wall. In the case where the laser elements 30 are provided on a submount 40, it is preferable for the light blocking film 22 to be provided at a position where the light emitted from the light reflection end surface reaches after it is further reflected by the submount 40. This allows any light reflected by the submount 40 also to be blocked by the light blocking film 22. If the light blocking film 22 is provided to cover all positions where the light emitted from the light reflecting end surface reaches directly or after being reflected by the inner wall of the recess 11, the main part of the laser light emitted from the light emitting end surface of each of the laser elements 30 may be blocked. For this reason, the light blocking film 22 need not be provided at all the positions where the light from the light reflection end surface reaches. Also, every time light from the laser elements 30 is reflected by a member, part of the light is absorbed by that member, so the light blocking film 22 need not be provided at positions where the light reflected by other members after being reflected by the light blocking film 22 reaches.

The light emitting device 100 can have a light reflector 50 that reflects the laser light from the laser elements 30 toward the light-transmissive member 21. In this case, the region through which the main part of the laser beam reflected by the light reflecting surface of the light reflector 50 passes is the light extraction region. The "main part of the laser beam" can be defined as the region in which light having an intensity of $1/e^2$ or more with respect to the peak intensity value is distributed. For example, the light extraction region is directly above the light reflection surface, which is the surface of the light reflector 50 that reflects the laser light. Therefore, in FIG. 1A, the light blocking film 22 is provided in a shape that surrounds the light reflector 50 in top view. To put this another way, the light blocking film 22 is not provided directly above the light reflecting surface of the light reflector 50. Consequently, the laser light reflected by the light reflecting surface of the light reflector 50 can be extracted to the outside without being blocked by the light blocking film 22. In FIG. 1B, the laser elements 30 are disposed so that the light emitting end surfaces thereof are facing the light reflecting surface of the light reflector 50. As shown in FIG. 1A, because the light blocking film 22 is provided at least between the light reflection end surfaces of the laser elements 30 and the edge of the recess 11 in top view, it is possible to reduce the likelihood that any light leaking out from the light reflection end surfaces will be extracted to the outside of the light emitting device 100.

Figure 3:
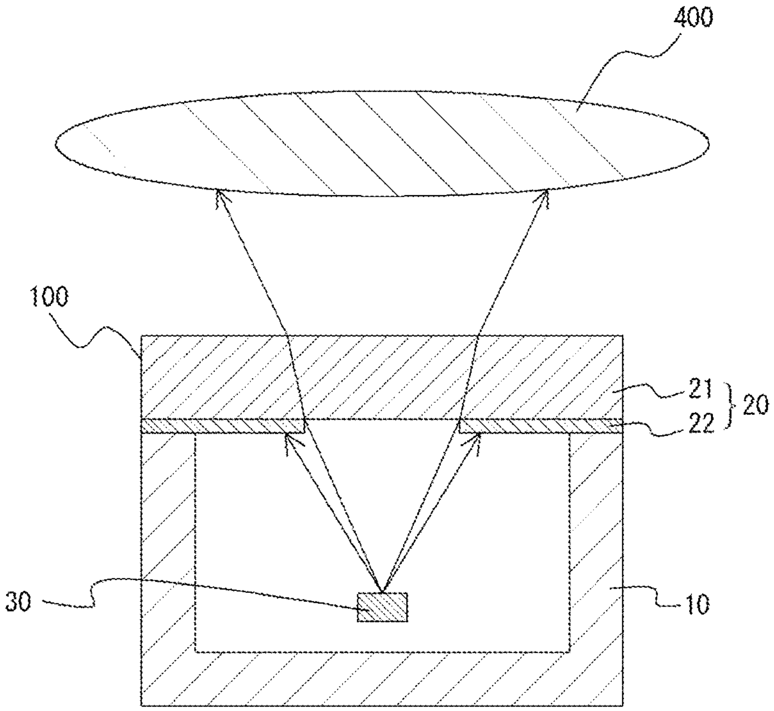
FIG. 3 is a cross-sectional view schematically showing an example of a combination of a light emitting device and a lens.

As shown in FIG. 1A, the light blocking film 22 can have a shape that has an opening. By using this opening as the light extraction port and overlapping other regions with the light blocking film 22, stray light is less likely to be extracted to the outside of the light emitting device 100. Also, as discussed below, the light blocking film 22 preferably has a shape with an opening in order to create a joining region for joining a part of the light blocking film 22 to the package 10. The size and position of the opening in the light blocking film 22 may be determined according to the amount of laser light to be extracted to the outside of the light emitting device 100. The opening in the light blocking film 22 may be provided in a size and at a position that will allow all of the main part of the laser beams from the laser elements 30 to pass. The opening in the light blocking film 22 is preferably such that the shortest distance among the linear distances between the edge of the main part of the laser beams on the lower surface 21*b* and the edge of the opening is 0.05 mm or less, and the longest distance is 0.5 mm or less. The opening in the light blocking film 22 need not be in a size and at a position that allows all of the main part of the laser beam from the laser elements 30 to pass, and a portion of the main part of the laser beam may be blocked by the light blocking film 22. FIG. 3 shows an example of a combination of a light emitting device 100 and a lens 400. In the case where the laser light extracted from the light emitting device 100 is incident on the lens, the laser light incident on the lens is preferably smaller than the effective diameter of the lens 400. This allows the laser light to fit within the effective diameter of the lens even if the relative positions of the light emitting device 100 and the lens 400 deviate from the design value, thereby reducing the possibility that stray light will be generated. As shown in FIG. 3, the light blocking film 22 is provided at a position where a part of the laser lights from the laser elements 30 will be blocked, so that the laser light from the light emitting device 100 and the effective diameter of the lens 400 will be in a relationship such as described above.

In the case where there are a plurality of laser elements 30, the light blocking film 22 may have one or more openings. As shown in FIG. 1A, in the case where a plurality of laser elements 30 are disposed on a single submount 40, the distance between the laser elements 30 is relatively short, so the light blocking film 22 preferably has just one opening. Examples of the shape of the opening in the light blocking film 22 include circular, elliptical, and polygonal. Since a shape in which the corners of a polygon are rounded is easier to form than a polygonal shape, such a shape may be used. For instance, as shown in FIG. 1A, in the case where a plurality of laser elements 30 are arranged in a line, the shape of the opening in the light blocking film 22 may be a quadrilateral, or a quadrilateral shape with rounded corners.

In FIG. 1A, the center of the light reflector 50 does not coincide with the center of the recess 11. Thus, it is preferable for the central portion of the recess 11 to be the region where the laser elements 30 are disposed, and for the light reflector 50 to be disposed between the laser elements 30 and the edge of the recess 11. This allows the light emitting device 100 to be more compact than in the case where the light reflection member 50 is disposed in the center portion of the recess 11. In addition, with an arrangement such as this, the light blocking film 22 can be formed in a shape having a narrow portion and a wide portion, so the mark 23 can be formed in the wide portion.

A plurality of laser elements 30 may be disposed in a single recess 11. The light emitting device 100 can have a plurality of laser elements configured to emit laser lights having different luminosity functions as the laser elements 30, for example. In this case, in top view, the mark 23 is preferably disposed closest to the laser element that emits the laser light having the lowest luminosity function among the plurality of laser elements 30. Since the mark 23 is formed on a part of the light blocking film 22, the light blocking ability in the portion of the light blocking film 22 where the mark 23 is formed may not be as good as in the portion where the mark is not formed. For example, in the case where the mark 23 is composed of a combination of a portion where the light blocking film 22 is present and a portion where the light blocking film 22 is absent, the light blocking ability of the region in which the mark 23 is formed will be lower than that of the other region. It is possible to reduce the influence of a reduction in the light blocking ability of the mark formation region by moving the mark 23 closer to the laser light sources with lower luminosity functions and relatively farther away from the laser light sources with higher luminosity functions. Therefore, such an arrangement is preferable in terms of reducing stray light. Luminosity function was used as a criterion here, but some other criterion may be used depending on the application of the light emitting device 100. For instance, in the case where reducing the leakage of short-wavelength light is emphasized, the mark 23 may be formed at a position relatively far from the laser elements that emit short-wavelength lights.

In FIG. 1A, the laser elements 30 include a blue laser element 31 that emits blue laser light, a green laser element 32 that emits green laser light, and a red laser element 33 that emits red laser light. Luminosity function is highest for green laser light, next highest for red laser light, and lowest for blue laser light. Therefore, in FIG. 1A, the mark 23 is disposed closest to the blue laser element 31. In FIG. 1A, the green laser element 32 is disposed between the blue laser element 31 and the red laser element 33. However, in the case that the emphasis is on stray light reduction, the positions of the red laser element 33 and the green laser element 32 may be reversed.

In FIG. 1A, the length in the resonator direction (cavity direction) is about the same for the blue laser element 31 and the green laser element 32, but is longer for the red laser element 33. This is because the red laser element 33 is different in efficiency from the other elements, as will be discussed below. For this reason, the red laser element 33 is made longer than the other elements in order to obtain roughly the same output from each laser element. In FIG. 1A, the light blocking film 22 overlaps only a part of the red laser element 33, and does not overlap the blue laser element 31 or the green laser element 32 at all, which are shorter in length in the cavity direction. In the case where a plurality of laser elements 30 having different lengths in the resonator direction are disposed in this way, the light blocking film 22 may overlap only a part of one of the laser elements 30. The "resonator direction" refers to the direction in which a ridge extends when a ridge is provided to the laser element, for example. The resonator direction is, for example, the direction in which the light emitting end surface and the light reflecting end surface are connected in the shortest distance.

It is also preferable to provide the mark 23 at a position where the possibility that the light from the laser elements 30 will reach is relatively low, in order to reduce the proportional increase in stray light due to the provision of the mark 23. More specifically, it is preferable for the mark 23 to be disposed so as to avoid an extension of the resonators of the laser elements 30 in top view. For instance, in the case where the laser elements 30 are provided with a ridge, an extension of the ridge in top view can be regarded as an extension of the resonator. In FIG. 1A, the mark 23 is disposed away from the region where the light emitting end surface and the light reflecting end surface of each laser element 30 extend in the resonator direction. Thus, it is more preferable for the mark 23 to be disposed so as to avoid the region in which the light emitting end surface and the light reflecting end surface of a laser element 30 extend in the resonator direction in top view. This allows for a further reduction in the proportional increase in stray light due to the provision of the mark 23. In FIG. 1A, the mark 23 and the laser elements 30 with a shorter length in the resonator direction (the blue laser element 31 and the green laser element 32) are disposed between the edge of the recess 11 and one side surface of the plurality of side surfaces of the laser device 30 having the longest length in the resonator direction (the red laser device 33). In the case where a plurality of laser elements 30 having different lengths in the cavity direction are arranged in this way, the mark 23 may be disposed so that it is closer to the laser elements 30 having a shorter length in the cavity direction than to the laser elements 30 having a longer length in the cavity direction in top view.

Package 10

The package 10 includes a main body 12 provided with the recess 11, and a metal film 13 provided on the surface of the main body 12 around the recess 11. The package 10 can be formed using ceramic as a main material. In addition, the package 10 can be formed by not only a ceramic but also a metal. Examples of the main material of the package 10 include aluminum nitride, silicon nitride, aluminum oxide and silicon carbide for ceramics, and copper, aluminum and iron for metals, and copper molybdenum, copper-diamond composite, and copper tungsten for composites. Alternatively, the bottom portion and the frame portion may be formed as separate members having different main materials, and the package 10 may be formed by joining the bottom portion and the frame portion.

In order to reduce stray light, it is preferable for the inner walls of the recess 11 to have low reflectance with respect to light from the laser elements 30. This is because stray light is reduced in proportion to how much light is absorbed by the inner walls of the recess 11. An example of such a material is an aluminum nitride ceramic. Forming the side walls of the recess from an aluminum nitride ceramic can be anticipated to have the effect of reducing stray light. The metal film 13 is, for example, a stacked film in which Ti, Pt, and Au are stacked in this order from the translucent member 21 side. The metal film 13 is a member for joining a joining member 60 described later, and may be omitted if unnecessary.

Cap 20

The cap 20 has the light-transmissive member 21 and the light blocking film 22. The light-transmissive member 21 has a bottom surface 21*b*, an upper surface 21*a*, and side surfaces. The light-transmissive member 21 is light-transmissive as a whole. The light-transmissive member 21 has a cuboid shape, for example. The light-transmissive member 21 can be formed using sapphire, glass, or the like as a main material. The light-transmissive member 21 is preferably formed from sapphire. Since sapphire has a higher thermal conductivity than glass, it has a high ability to diffuse heat during processing when the mark 23 is formed using a processing laser beam described later. Therefore, damage such as microcracks due to a thermal load during processing can be reduced, and thereby long-term reliability of the light emitting device 100 can be improved.

The light blocking film 22 is a film that blocks light from the laser elements 30. The light blocking film 22 can be a film having a transmittance of 5% or less with respect to the peak wavelength of the laser light emitted from the laser element. The transmittance of the light blocking film 22 is preferably 5% or less in a wavelength band having an intensity of $1/e^2$ or more of the peak wavelength of the laser light. Also, taking into account the variance in the oscillation wavelength of the laser elements 30 that may occur during manufacture, the transmittance may be 5% or less over a wider range than the wavelength of the actual laser light. In the case where there are a plurality of laser elements 30 and the wavelengths of the emitted laser beams are different, the transmittance of the light blocking film 22 is preferably 5% or less with respect to the wavelengths of all the laser beams. The minimum value of the transmittance of the light blocking film 22 is 0.1%, for example. The light blocking film 22 may be a film that reflects laser light, or may be a film that absorbs it. In order to further reduce stray light, it is preferable for the absorbance with respect to the wavelength of the laser light to be 50% or more. The maximum value of the absorption rate of the light blocking film 22 may be 100%, for example, 99% or less. The light blocking film 22 is, for example, a metal film. Another material such as an oxide film and a metal film may be combined. Examples of the material of the light blocking film 22 include metal materials such as Ti, Pt, Au, Ni, Ru, Rh, Co, Cr and the like. The light blocking film 22 has, for example, a structure in which Ti, Pt, and Au are stacked in this order from the light transmissive member 21 side.

It is preferable for the light blocking film 22 to extend to the outer edge of the light-transmissive member 21, or to the vicinity of the outer edge. Here, "the vicinity of the outer edge" refers to the region having a distance of no more than 500 μm from the outer edge. The cap 20 and the package 10 are joined by connecting the joining member 60 to a part of the light blocking film 22. This allows the light blocking film 22 to be provided up to the joint portion between the cap 20 and the package 10, which is advantageous for reducing stray light. It is preferable to use a metal adhesive as the joining member 60. This is because this material is less likely to be affected by laser light than a resin adhesive. Also, with a resin adhesive there is the risk that dust will cling to the light emitting end surface of the laser element 30 due to outgassing, but with a metal adhesive, there is no outgassing, or less than with a resin adhesive, so dust is less likely to collect. When a metal adhesive is used as the bonding member 60, the light blocking film 22 can be a metal film so that it will bond better with the bonding member 60. Examples of metal adhesives include Au—Sn, Ni—Sn, silver particles, gold particles, and copper particles. In FIG. 1B, part of the light blocking film 22 and part of the light-transmissive member 21 are disposed directly on the bonding member 60. Thus disposing not only the light blocking film 22 but also the light-transmissive member 21 directly on the bonding member 60 allows the light emitting device 100 to be smaller in size than in the case where only the light blocking film 22 is disposed.

The closed space formed by joining the package 10 and the cap 20 becomes a hermetically sealed space. This hermetic sealing makes it less likely that organic matter or other such dust will cling to the light emitting end surface of the laser elements 30.

Figure 2:
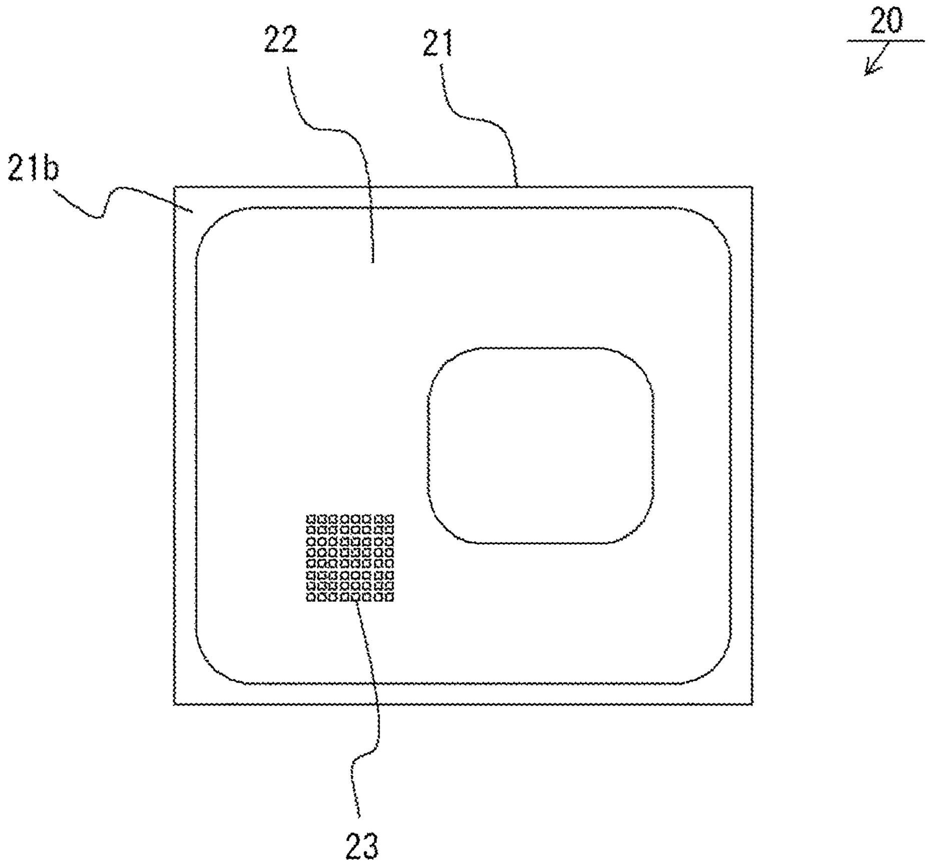
FIG. 2 is a schematic bottom view of a cap.

FIG. 2 is a schematic bottom view the cap 20 as seen from the lower surface 21*b* side. The mark 23 is a two-dimensional code, for example. The mark 23 may be constituted by a combination of portions where the light blocking film 22 is present and absent. Such a mark 23 can be formed by laser processing, as will be described below. Alternatively, for a further reduction of stray light, the mark 23 may be constituted by a combination of a portion having the same color as the rest of the light blocking film 22, and a portion of a different color. In addition, in the case where the mark 23 is a number or a letter, it may be constituted by only a portion where there is no light blocking film 22, or a portion where the color is different.

An antireflection film may be provided in the light extraction region of the upper surface 21*a* and/or the lower surface 21*b* of the light-transmissive member 21.

Laser Elements 30

The laser elements 30 each have a lower surface, an upper surface, and a plurality of side surfaces, and emit laser light from a light emitting end surface that is one of the side surfaces. A laser element 30 can have a blue laser element 31 that emits blue laser light, a green laser element 32 that emits green laser light, and a red laser element 33 that emits red laser light. Laser elements 30 that emit light of other colors may also be used, and a plurality of laser elements 30 that emit light of the same color may be disposed. Also, just one or a plurality of the laser elements 30 may be provided. In FIG. 1A, all the laser elements 30 are disposed on one side of the light reflector 50, but the laser elements 30 can also be disposed on both sides of the light reflector 50.

The blue light refers to light whose emission peak wavelength is in the range of 420 nm to 494 nm. The peak wavelength of the laser light emitted from the blue laser element 31 may be in the range of 440 nm to 475 nm. The green light refers to light having an emission peak wavelength in the range of 495 nm to 570 nm. The peak wavelength of the laser light emitted from the green laser element 32 may be in the range of 510 nm to 550 nm. The peak wavelength of the laser light emitted from the green laser element 32 may be in the range of 510 nm to 550 nm. The blue laser element 31 or the green laser element 32 includes a semiconductor laser element having a nitride semiconductor. For example. GaN, InGaN, and AlGaN can be used as the nitride semiconductor. The red light refers to light whose emission peak wavelength in the range of 605 nm to 750 nm. The peak wavelength of the laser light emitted from the red laser element 3 may be in the range of 610 nm to 700 nm. Examples of the red laser element 33 include a semiconductor laser element having an InAlGaP-based, GaInP-based, GaAs-based, or AlGaAs-based semiconductor.

The laser elements 30 may be fixed to the package 10 via the submount 40. The submount 40 has a cuboid shape, for example. The submount 40 can be formed from silicon nitride, aluminum nitride, or silicon carbide, for example. A metal film is provided to a portion of the submount 40.

The main material of the light reflector 50 can be quartz, BK7 (borosilicate glass), or another such type of glass, aluminum or another such metal, silicon, or the like. The light reflector 50 can form a light reflecting surface by providing a light reflecting film on a portion of the surface of the main material. As the light reflecting film, a metal such as Ag or Al, or a dielectric multilayer film such as $Ta_2O_5/SiO_2$, $TiO_2/SiO_2$, or $Nb_2O_5/SiO_2$ can be employed. The light reflector 50 may be formed using a material having a high optical reflectance, such as a metal, and the light reflecting film may be omitted. The light reflecting surface of the light reflector 50 can have an optical reflectance of 99% or more with respect to the peak wavelengths of the laser light to be reflected. The optical reflectance here can be 100% or less, or less than 100%.

The light emitting device 100 may have a protective element such as a Zener diode. The laser elements 30 and the protective element are electrically connected to the conductive members of the package 10 via a wire or the like. The laser element 30 and the protection element are energized by energizing the outer electrode of the package 10, which is electrically connected to the conductive members.

Method for Manufacturing Light Emitting Device

Figure 4:
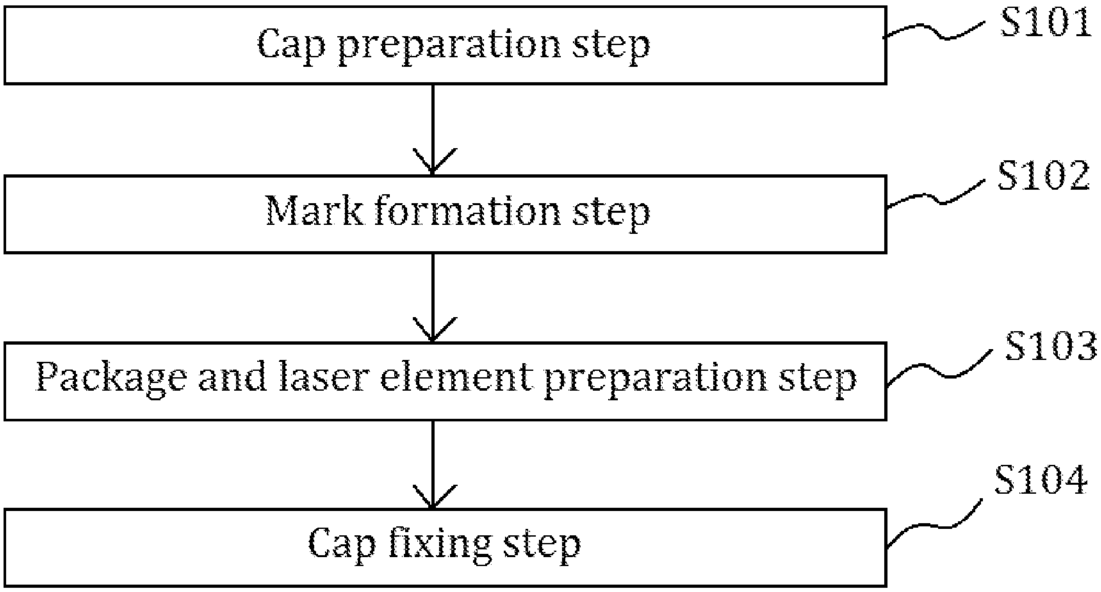
FIG. 4 is a flowchart showing the process of manufacturing the light emitting device according to an embodiment of the present disclosure.

FIG. 4 is a flowchart schematically showing the steps for manufacturing the light emitting device according to an embodiment. As shown in FIG. 4, the method for manufacturing the light emitting device in this embodiment includes a cap preparation step S101, a mark formation step S102, a package and laser element preparation step S103, and a cap fixing step S104. In the case that the cap fixing step S104 is performed after the mark forming step S102, the machining dust generated in the formation of the mark 23 will be less likely to adhere to the laser elements 30 and so forth.

Cap Preparation Process S101

Figure 5:
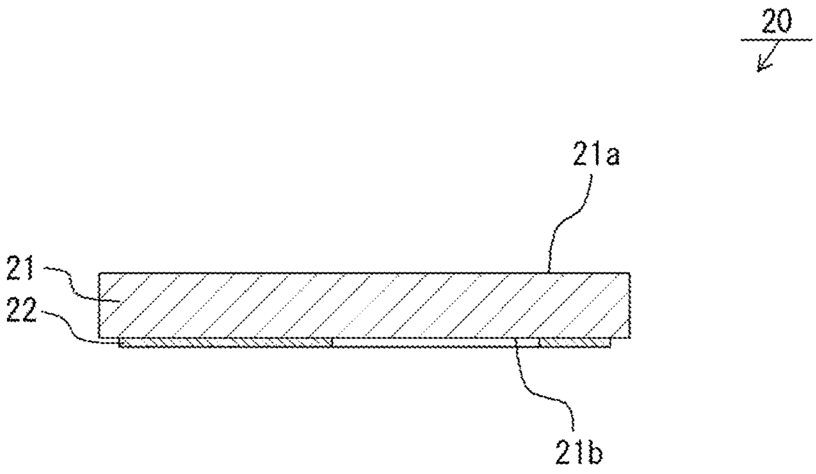
FIG. 5 is a cross-sectional view schematically showing a cap preparation step.

In the cap preparation step S101, as shown in FIG. 5, the cap 20 is prepared, which has the light-transmissive member 21 having the upper surface 21*a* (first main surface) and the lower surface 21*b* (second main surface), and the light blocking film 22 that is provided to a portion of the lower surface 21*b*. In this state, no mark has been provided to the light blocking film 22 yet.

Mark Formation Step S102

In the mark formation step S102, a part of the light blocking film 22 is processed to form a mark 23 from which specific information can be read. The mark 23 is formed in a shape that allows specific information to be read. For instance, a two-dimensional code or a several-digit number is an example of the mark 23. The mark 23 shown in FIG. 2 schematically shows a two-dimensional code. The two-dimensional code is, for example, a pattern in which a plurality of square cells are arranged in a matrix. Examples of the specific information include the product model number, lot number, date, serial number, rank information, and so forth. The information is read from the mark 23 by, for example, using a reading machine or device (such as a reader device that reads two-dimensional code) to read a photograph captured optically. The size of the mark 23 may be a size that fits within a rectangle measuring 600 μm in length and 600 μm in width, for example.

Figure 6:
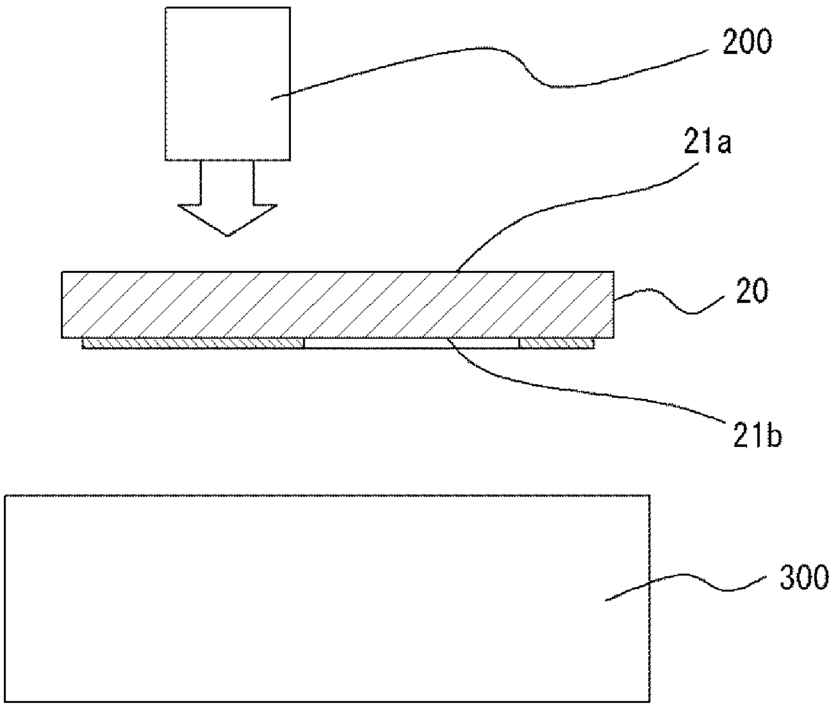
FIG. 6 is a cross-sectional view schematically showing a mark forming step.

In the mark formation step S102, the mark 23 can be formed by irradiating the light-transmissive member 21 from the upper surface 21*a* side with a processing laser beam. For example, as shown in FIG. 6, a processing laser beam source 200 is disposed on the upper surface 21*a* side of the light-transmissive member 21. The cap 20 is irradiated with the processing laser beam emitted from the processing laser beam source 200, and the light passes through the light-transmitting member 21 and performs processing (e.g., formation of the mark) on the light blocking film 22. The mark 23 can be formed by photolithography, but if the processing is performed by a method involving the use of a processing laser beam, the photolithography mask will be unnecessary, and the mark 23 can be manufactured at lower cost. With photolithography, it is necessary to produce different masks in order to print marks of different shapes, but with processing using a processing laser beam, marks of different shapes can be printed just by changing the printing program. A YAG laser is an example of the processing laser beam source 200. The peak wavelength of the processing laser beam is a wavelength that can be transmitted through the light-transmissive member 21. For example, in the case where sapphire is used as the light-transmissive member 21, the wavelength can be in a range of 300 to 3000 nm. For example, processing can be performed using green laser light, which is the second harmonic of a YAG laser.

As shown in FIG. 6, in the mark formation step S102, a suction device 300 can be disposed on the lower surface 21*b* side of the light-transmissive member 21. This suction device 300 is used during irradiation with the laser beam to suck up the processing dust generated by the processing laser light irradiation. In the case that the processing dust adheres to the lower surface 21*b* or the light blocking film 22, there is the possibility that it will cling to the laser elements 30 or the like to be combined in a subsequent step. Performing suction during the processing of the mark 23 reduces this possibility. Employing a configuration in which the processing laser light irradiates from the upper surface 21*a* side allows the suction device 300 to be disposed on the lower surface 21*b* side. An example of the suction device 300 is a suction device featuring a vacuum pump.

The marks 23 may be formed all at once for a plurality of caps 20. For example, a wafer may be prepared in which a plurality of caps 20 are linked together, and the individual caps 20 may be separated after the marks 23 have been formed.

Package and Laser Element Preparation Step S103

Figure 7A:
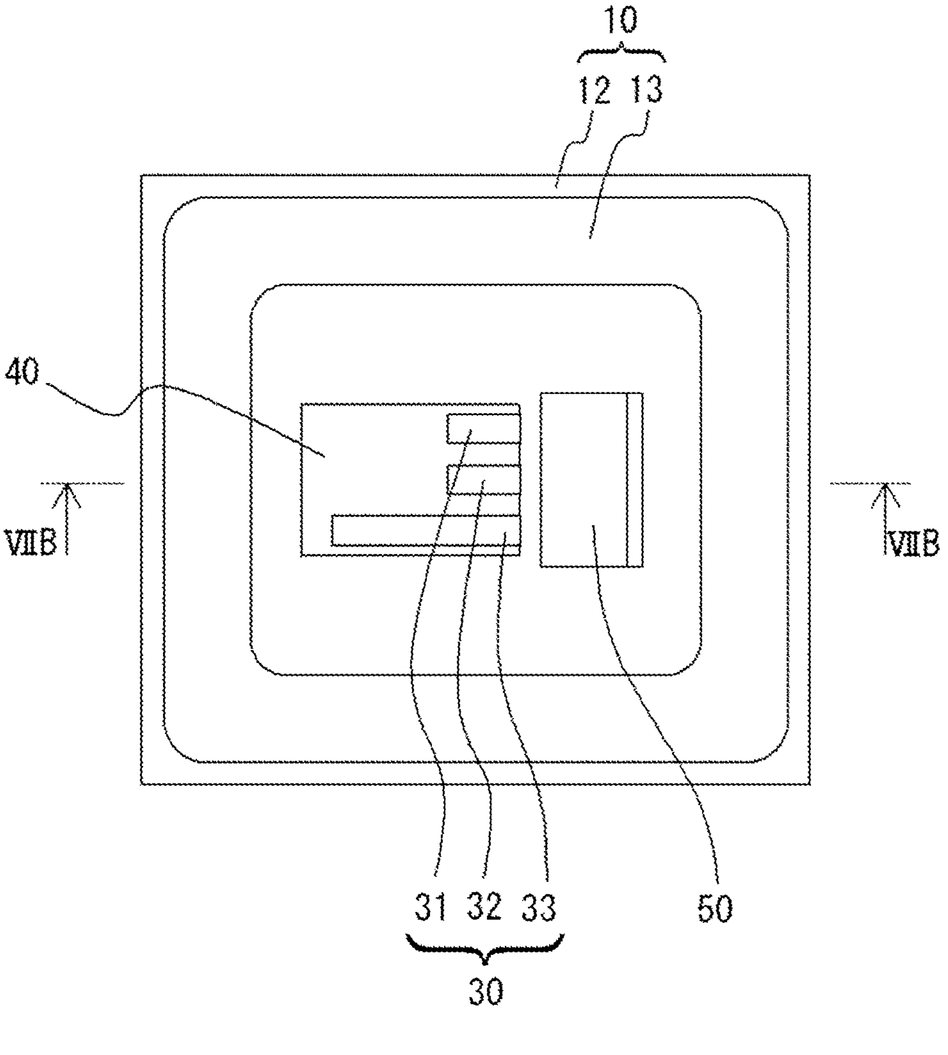
FIG. 7A is a plan view schematically showing a package and laser element preparation step.
Figure 7B:
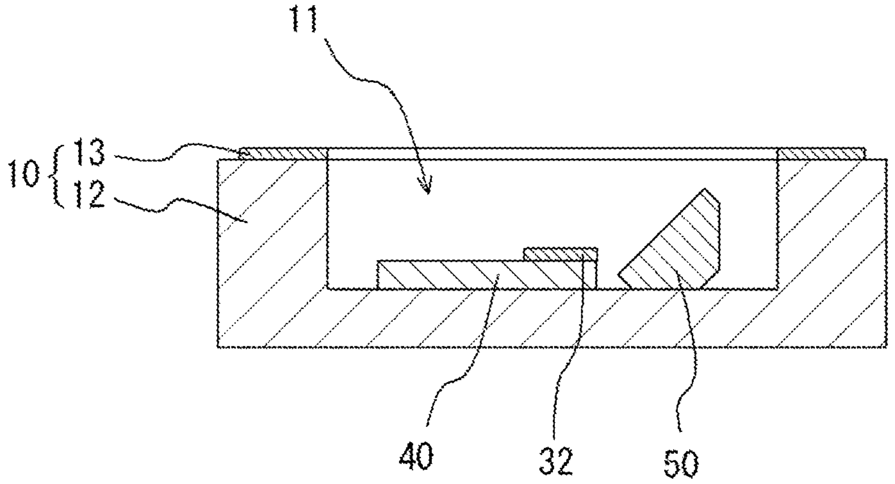
FIG. 7B is a cross-sectional view schematically showing the package taken along line VIIB-VIIB in FIG. 7A.

In the package and laser element preparation step S103, as shown in FIGS. 7A and 7B, the package 10 provided with the recess 11 and one or more laser elements 30 disposed in the recess 11 are prepared. The package and laser element preparation step S103 should be carried out at least before the cap fixing step S104, but may be performed before the step S101 or the step S102, or may be performed at the same time.

Cap Fixing Step S104

In the cap fixing step S104, the cap 20 is fixed to the package 10 so as to cover the recess 11, with the side on which the mark 23 is formed being on the package 10 side. This gives the light emitting device 100 shown in FIGS. 1A and 1B.

The light-emitting device described in the present embodiment can be used as a light source of a projector, a vehicle headlight, an illumination, a display backlight and the like.

What is claimed is:

1. A light emitting device comprising:

a package including a metal film;

a cap including a light-transmissive member having a lower surface facing the package and an upper surface opposite to the lower surface, and a light blocking film arranged on the lower surface of the light-transmissive member and having a shape defining at least one opening;

a joining member joining a part of the light blocking film and the metal film; and at least one laser element positioned in a space bounded by the cap and the package such that a part of an edge of the at least one opening defined by the light blocking film is disposed directly above the at least one laser element.

2. The light emitting device according to claim 1, wherein a shape of the at least one opening defined by the light blocking film is a quadrilateral shape with rounded corners in a top view.

3. The light emitting device according to claim 1, wherein at least a part of the at least one laser element is visible through the at least one opening defined by the light blocking film in a top view.

4. The light emitting device according to claim 1, further comprising at least one light reflector having a light reflecting surface reflecting laser light from the at least one laser element toward the at least one opening defined by the light blocking film.

5. The light emitting device according to claim 4, wherein the at least one light reflector has a first light reflector having a first light reflecting surface, and an entire area of the first light reflecting surface is visible through the at least one opening defined by the light blocking film in a top view.

6. The light emitting device according to claim 1, further comprising a submount on which the at least one laser element is provided.

7. The light emitting device according to claim 6, wherein a part of the submount is visible through the at least one opening defined by the light blocking film in a top view.

8. The light emitting device according to claim 1, wherein the light blocking film extends to an outer edge of the light-transmissive member or to a vicinity of the outer edge of the light-transmissive member.

9. The light emitting device according to claim 1, wherein the joining member is a metal adhesive.

10. The light emitting device according to claim 1, wherein the light blocking film is a metal film.

11. A light emitting device comprising:

a package including a metal film;

a cap including a light-transmissive member having a lower surface facing the package and an upper surface opposite to the lower surface, and a light blocking film arranged on the lower surface of the light-transmissive member and having a shape defining at least one opening;

a joining member joining a part of the light blocking film and the metal film;

a submount positioned in a space bounded by the cap and the package such that a part of an edge of the at least one opening defined by the light blocking film is disposed directly above the submount; and at least one laser element disposed on the submount.

12. The light emitting device according to claim 11, wherein a shape of the at least one opening defined by the light blocking film is a quadrilateral shape with rounded corners in a top view.

13. The light emitting device according to claim 11, wherein at least a part of the at least one laser element is visible through the at least one opening defined by the light blocking film in the top view.

14. The light emitting device according to claim 11, further comprising at least one light reflector having a light reflecting surface reflecting laser light from the at least one laser element toward the at least one opening defined by the light blocking film.

15. The light emitting device according to claim 14, wherein the at least one light reflector has a first light reflector having a first light reflecting surface, and an entire area of the first light reflecting surface is visible through the at least one opening defined by the light blocking film in the top view.

16. The light emitting device according to claim 11, wherein a part of the submount is visible through the at least one opening defined by the light blocking film in the top view.

17. The light emitting device according to claim 11, wherein the light blocking film extends to an outer edge of the light-transmissive member or to a vicinity of the outer edge of the light-transmissive member.

18. The light emitting device according to claim 11, wherein the joining member is a metal adhesive.

19. The light emitting device according to claim 11, wherein the light blocking film is a metal film.

* * * * *